US010666133B2

(12) United States Patent
Knauss et al.

(10) Patent No.: US 10,666,133 B2
(45) Date of Patent: May 26, 2020

(54) CALIBRATION OF A LOAD CONTROL DEVICE FOR A LIGHT-EMITTING DIODE LIGHT SOURCE

(71) Applicant: Lutron Technology Company LLC, Coopersburg, PA (US)

(72) Inventors: Matthew Knauss, Somerville, MA (US); Matthew W. Nuhfer, Medford, MA (US); Christopher G. Udall, Plainville, MA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 15/959,593

(22) Filed: Apr. 23, 2018

(65) Prior Publication Data

US 2018/0241304 A1    Aug. 23, 2018

Related U.S. Application Data

(62) Division of application No. 14/975,560, filed on Dec. 18, 2015, now Pat. No. 9,954,435.

(Continued)

(51) Int. Cl.
*H05B 33/00* (2006.01)
*H02M 3/04* (2006.01)
(Continued)

(52) U.S. Cl.
CPC ........ *H02M 3/04* (2013.01); *G01R 19/16538* (2013.01); *H05B 33/089* (2013.01);
(Continued)

(58) Field of Classification Search
CPC ............ H05B 33/0815; H05B 33/0845; H05B 33/0851; H05B 37/02; H05B 33/0812;
(Continued)

(56) References Cited

U.S. PATENT DOCUMENTS 8,451,116 B2    5/2013  Steiner et al.
8,492,984 B2    7/2013  Nuhfer et al.
(Continued)

FOREIGN PATENT DOCUMENTS

CN    104137486 A    11/2014
WO    2010111256 A2    9/2010
(Continued)

*Primary Examiner* — Monica C King
(74) *Attorney, Agent, or Firm* — Amy Yanek; Glen Farbanish; Philip Smith

(57) ABSTRACT

A load regulation device for controlling the amount of power delivered to an electrical load may be able to calibrate the magnitude of an output voltage of the load regulation device in order to control the magnitude of a load voltage across the electrical load to a predetermined level. The load regulation device may receive the feedback from a calibration device adapted to be coupled to load wiring near the electrical load. The feedback may indicate when the magnitude of the load voltage across the electrical load has reached a predetermined level. The load regulation device may gradually adjust the magnitude of the output voltage, receive the feedback from the calibration device, and then use the feedback to determine the magnitude of the output voltage corresponding to when the magnitude of the load voltage across the electrical load has reached the predetermined level.

20 Claims, 9 Drawing Sheets

Related U.S. Application Data

(60) Provisional application No. 62/094,128, filed on Dec. 19, 2014.

(51) Int. Cl.
*H05B 37/02* (2006.01)
*G01R 19/165* (2006.01)
*H05B 33/08* (2020.01)
*H02M 1/00* (2006.01)

(52) U.S. Cl.
CPC ..... *H05B 33/0815* (2013.01); *H05B 33/0851* (2013.01); *H05B 37/0272* (2013.01); *H02M 2001/0009* (2013.01)

(58) Field of Classification Search
CPC .. H05B 33/08; H05B 33/0887; H05B 33/089; H05B 33/0827; H05B 33/0848; H05B 37/0209; H05B 33/0809; H05B 33/0854; H05B 33/0818; H05B 33/0824; H05B 39/044; H05B 33/0857; H05B 37/0263; H05B 37/0272; H05B 41/295; H05B 33/0806; H05B 33/0821; H05B 33/0842; H05B 33/0884; H05B 37/00; H05B 37/0254; H05B 41/24; H05B 41/245; H05B 41/2928; H05B 41/34; H05B 41/38; H05B 41/39; H05B 41/3924
See application file for complete search history.

(56) References Cited

U.S. PATENT DOCUMENTS

| | | |
|---|---|---|
| 2011/0080110 A1 | 4/2011 | Nuhfer et al. |
| 2014/0001977 A1 | 1/2014 | Zaharchuk et al. |
| 2014/0009084 A1* | 1/2014 | Veskovic ............... H05B 33/08 315/307 |
| 2014/0009085 A1 | 1/2014 | Veskovic |
| 2014/0265568 A1 | 9/2014 | Crafts et al. |
| 2014/0265880 A1 | 9/2014 | Taipale et al. |
| 2014/0265897 A1 | 9/2014 | Taipale et al. |

FOREIGN PATENT DOCUMENTS

| | | |
|---|---|---|
| WO | 2012125625 A1 | 9/2012 |
| WO | 2013101766 A1 | 7/2013 |

\* cited by examiner

CALIBRATION OF A LOAD CONTROL DEVICE FOR A LIGHT-EMITTING DIODE LIGHT SOURCE

CROSS REFERENCE TO RELATED APPLICATIONS

This application is a divisional application of U.S. patent application Ser. No. 14/975,560, filed Dec. 18, 2015, now U.S. Pat. No. 9,954,435, issued Apr. 24, 2018, which claims the benefit of Provisional U.S. Patent Application No. 62/094,128, filed Dec. 19, 2014, the disclosures of which are incorporated herein by reference in their entireties.

BACKGROUND

Light-emitting diode (LED) light sources (e.g., LED light engines) are often used in place of or as replacements for conventional incandescent, fluorescent, or halogen lamps, and the like. LED light sources may comprise a plurality of light-emitting diodes mounted on a single structure and/or provided in a suitable housing, for example. LED light sources are typically more efficient and provide longer operational lives as compared to incandescent, fluorescent, and halogen lamps. In order to illuminate properly, an LED driver control device (i.e., an LED driver) may be coupled between an alternating-current (AC) source and the LED light source for regulating the power supplied to the LED light source. The LED driver may regulate either the voltage provided to the LED light source to a particular value or the current supplied to the LED light source to a specific peak current value, or may regulate both the current and voltage.

LED light sources may be rated to be driven via a number of different control techniques including, for example, a current load control technique or a voltage load control technique. An LED light source that is rated for the current load control technique may be characterized by a rated current (e.g., approximately 350 milliamps) to which the peak magnitude of the current through the LED light source should be regulated to ensure that the LED light source is illuminated to the appropriate intensity and color. In contrast, an LED light source that is rated for the voltage load control technique may be characterized by a rated voltage (e.g., approximately 15 volts) to which the voltage across the LED light source should be regulated to ensure proper operation of the LED light source. One or more parallel strings of LEDs in an LED light source rated for the voltage load control technique may include a current balance regulation element to ensure that the parallel strings have similar impedance so that similar current may be drawn in each of the parallel strings.

LED drivers may be configured to dim the light output of an LED light source. Example methods of dimming LEDs include a pulse-width modulation (PWM) technique and a constant current reduction (CCR) technique. Pulse-width modulation dimming may be used for LED light sources that are controlled in a current or voltage load control mode, for example. In pulse-width modulation dimming, a pulsed signal with a varying duty cycle is supplied to the LED light source. If an LED light source is being controlled using the current load control technique, the peak current supplied to the LED light source is kept constant during an on time of the duty cycle of the pulsed signal. However, as the duty cycle of the pulsed signal varies, the average current supplied to the LED light source may also vary, thereby varying the intensity of the light output of the LED light source. If the LED light source is being controlled using the voltage load control technique, the voltage supplied to the LED light source is kept constant during the on time of the duty cycle of the pulsed signal in order to achieve the desired target voltage level, and the duty cycle of the load voltage is varied in order to adjust the intensity of the light output. Constant current reduction dimming may be used, for example, when an LED light source is being controlled using the current load control technique. In constant current reduction dimming, current may be continuously provided to the LED light source while the DC magnitude of the current provided to the LED light source may be varied to thus adjust the intensity of the light output. Examples of LED drivers are described in greater detail in commonly-assigned U.S. Pat. No. 8,492,988, issued Jul. 23, 2010, entitled CONFIGURABLE LOAD CONTROL DEVICE FOR LIGHT-EMITTING DIODE LIGHT SOURCE, and U.S. Patent Application Publication No. 2013/0063047, published Mar. 14, 2013, entitled LOAD CONTROL DEVICE FOR A LIGHT-EMITTING DIODE LIGHT SOURCE, the entire disclosures of which are hereby incorporated by reference.

If the LED light source is being controlled using the voltage load control technique, the magnitude of the voltage at the output of the LED driver may differ from the magnitude of the voltage across the LED light source due to, for example, the impedance of the electrical wiring between the LED driver and the LED light source. Accordingly, the magnitude of the voltage across the LED light source may not be equal to the rated voltage of the LED light source. In addition, under the example scenario described herein, the length of the electrical wiring between the LED driver and the LED light source may vary from one installation and/or circuit to the next. As a result, the magnitude of the voltage across the LED light source and thus the intensity of the LED light source may vary from one installation and/or circuit to the next for a given output voltage of the LED driver. If there are multiple installations of LED light sources controlled by a single LED driver in a room and each of LED light sources has a different length of electrical wiring between the LED driver and the respective LED light source, the intensities of all of the LED light sources may appear different to an occupant of the room, which is undesirable.

SUMMARY

As described herein, a load regulation device for controlling the amount of power delivered to an electrical load may be able to calibrate the magnitude of an output voltage of the load regulation device in order to control the magnitude of a load voltage across the electrical load to a predetermined level. The load regulation device may comprise a load regulation circuit configured to generate the output voltage for producing the load voltage across the electrical load, and a control circuit configured to adjust the magnitude of the output voltage of the load regulation circuit based on external feedback. The control circuit may be configured to gradually adjust the magnitude of the output voltage and to receive the external feedback indicating when the magnitude of the load voltage across the electrical load has reached or exceeded the predetermined level. The load regulation device may use the feedback to determine the magnitude of the output voltage corresponding to when the magnitude of the load voltage across the electrical load has reached the predetermined level.

A load control system for controlling the amount of power delivered from a power source to an electrical load may comprise a load regulation device adapted to be coupled to the electrical load via load wiring, and a calibration device adapted to be coupled to the load wiring near the electrical load. The load regulation device may be configured to generate an output voltage for producing a load voltage across the electrical load. The calibration device may be configured to provide feedback to the load regulation device indicating when the magnitude of the load voltage across the electrical load has reached a predetermined level. The load regulation device may be configured to gradually adjust the magnitude of the output voltage and to receive the feedback indicating when the magnitude of the load voltage across the electrical load has reached the predetermined level from the calibration device.

A calibration circuit for calibrating an output voltage of a load regulation device for an electrical load is also described herein. The calibration circuit may comprise a voltage sense circuit for sensing a magnitude of a load voltage developed across the electrical load, and a communication circuit for providing feedback via the power wiring when the voltage sense circuit indicates that the magnitude of the load voltage has reached or exceeded a predetermined level.

DETAILED DESCRIPTION

Figure 1:
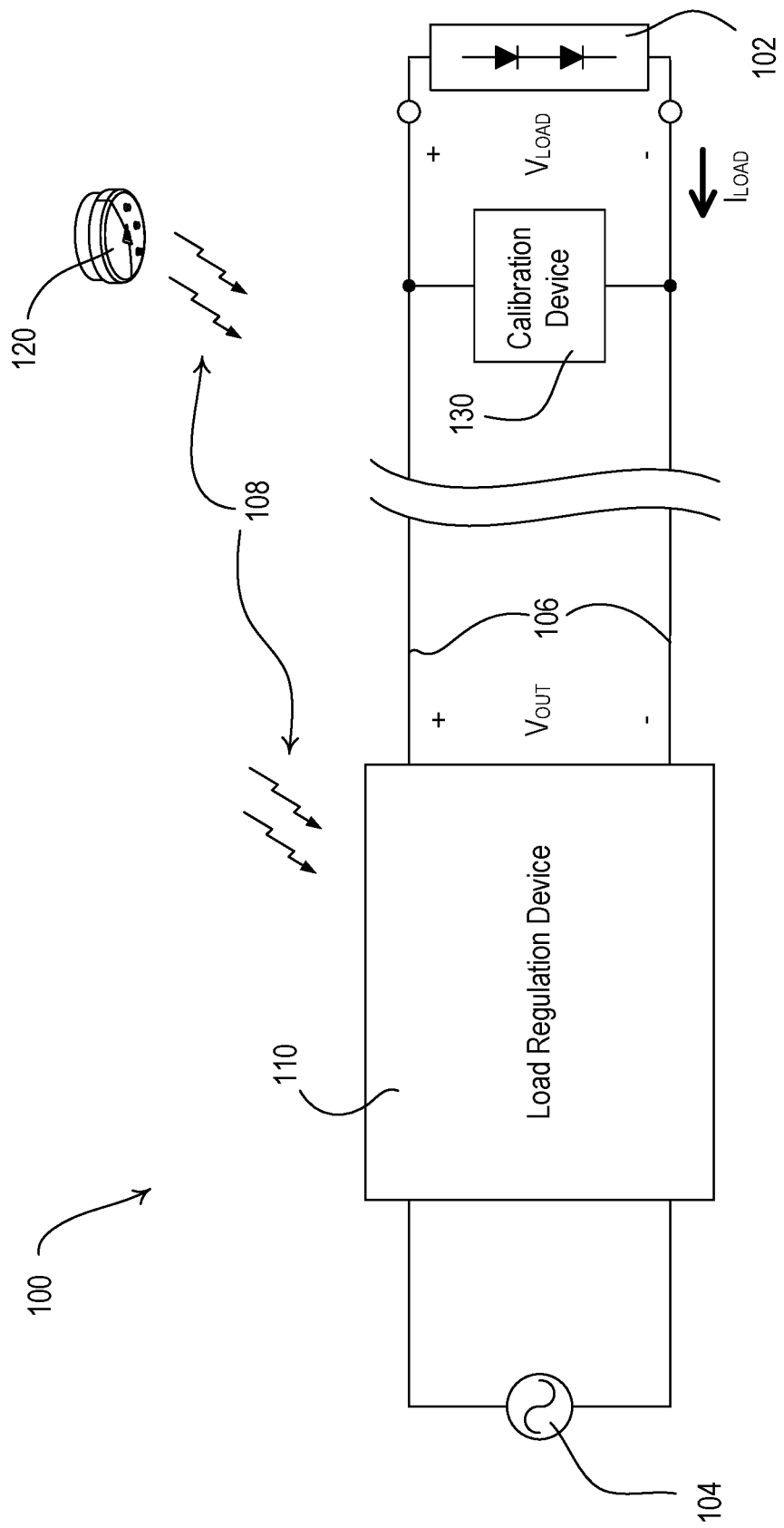
FIG. 1 is a simplified block diagram of an example load control system for controlling the amount of power delivered to an electric al load, such as, an LED light source.

FIG. 1 is a simplified block diagram of an example load control system 100 for controlling the amount of power delivered to an electrical load 102, such as, a light-emitting diode (LED) light source (e.g., an LED light engine). The load control system 100 may comprise a load regulation device 110, such as, an LED driver, for controlling the electrical load 102 (e.g., controlling the intensity of a LED light source). The load regulation device 110 may be coupled to a power source, e.g., an alternating-current (AC) power source 104 generating an AC line voltage. The electrical load 102 may be characterized by a rated load voltage $V_{RATED}$ (e.g., approximately 24 volts for a LED light source). The electrical load 102 is shown in FIG. 1 as two LEDs connected in series but may comprise a single LED, a plurality of LEDs connected in parallel or a suitable combination thereof, one or more organic light-emitting diodes (OLEDs), other lighting devices, a motorized window treatment, an HVAC system, and the like. Further, the power source may comprise a direct-current (DC) power source generating a DC supply voltage for certain electrical loads.

The load regulation device 110 may be configured to generate an output voltage $V_{OUT}$, which may be coupled to the electrical load 102 via load wiring 106. The electrical load 102 may develop a load voltage $V_{LOAD}$ and conduct a load current $I_{LOAD}$. Where the electrical load 102 comprises an LED light source, the load regulation device 110 may be configured to turn the LED light source on and off, and to adjust the intensity of the LED light source between a minimum intensity (e.g., approximately 1%) and a maximum intensity (e.g., approximately 100%). The load regulation device 110 may be configured to pulse-width modulate the output voltage $V_{OUT}$ to adjust the intensity of the LED light source between the minimum and maximum intensities, e.g., by adjusting the duty cycle of the output voltage $V_{OUT}$. In addition to or in lieu of pulse-width modulating the output voltage $V_{OUT}$, the load regulation device 110 may be configured to pulse-frequency modulate the output voltage $V_{OUT}$ to adjust the intensity of the LED light source between the minimum and maximum intensities, e.g., by adjusting the frequency of the output voltage $V_{OUT}$ The load regulation device 110 may be configured to receive wireless signals, e.g., radio-frequency (RF) signals 108, from one or more input devices. For example, where the electrical load 102 comprises a LED light source, the load regulation device 110 may be configured to receive wireless signals from a wireless battery-powered light sensor 120. The light sensor 120 may be configured to measure the total light intensity at the sensor due to natural light (e.g., daylight or sunlight) and/or artificial light (e.g., as emitted by the LED light source). The light sensor 120 may be configured to transmit a digital message including the measured light intensity to the load regulation device 110 via the RF signals 108. The load regulation device 110 may be configured to control the LED light source in response to the RF signals received from the light sensor 120. Examples of wireless light sensors are described in greater detail in commonly-assigned U.S. Pat. No. 8,451,116, issued May 28, 2013, entitled WIRELESS BATTERY-POWERED DAYLIGHT SENSOR, the entire disclosure of which is hereby incorporated by reference.

The load control system 100 may comprise other types of input devices, such as, for example, occupancy sensors, vacancy sensors, motion sensors, security sensors, proximity sensors, daylight sensors, window sensors, shadow sensors, cloudy-day sensors, temperature sensors, humidity sensors, radiometers, pressure sensors, smoke detectors, carbon monoxide detectors, air-quality sensors, fixture sensors, partition sensors, keypads, battery-powered remote controls, kinetic or solar-powered remote controls, key fobs, mobile communication devices (such as cell phones, smart phones, tablets), personal digital assistants, personal computers, laptops, timeclocks, audio-visual controls, safety devices, power monitoring devices (such as power meters, energy meters, utility submeters, utility rate meters), central control transmitters, residential, commercial, or industrial controllers, or any combination of these input devices. Examples of load control systems are described in greater detail in commonly-assigned U.S. Patent Application Publication No. 20140001977, published Jan. 2, 2014, entitled LOAD CONTROL SYSTEM HAVING INDEPENDENTLY-CONTROLLED UNITS RESPONSIVE TO A BROADCAST CONTROLLER, and U.S. patent application Ser. No. 13/830,237, filed Mar. 14, 2013, entitled COMMISSIONING LOAD CONTROL SYSTEMS, the entire disclosures of which are hereby incorporated by reference.

The magnitude of the load voltage $V_{LOAD}$ at the electrical load 102 may differ from the magnitude of the output voltage $V_{OUT}$ at the load regulation device 110. The voltage difference may be caused by one or more conditions including, for example, the impedance (e.g., resistance) of the load wiring 106 and the magnitude of the load current $I_{LOAD}$. Since the length of the load wiring 106 may vary from one installation and/or circuit to the next, the magnitude of the load voltage $V_{LOAD}$ at the electrical load 102 and thus certain functional aspects of the electrical load 102 (e.g., the intensity of an LED light source) may vary from one installation and/or circuit to the next at a given magnitude of the output voltage $V_{OUT}$. The load regulation device 110 may be configured to calibrate the magnitude of the output voltage $V_{OUT}$, such that the magnitude of the load voltage $V_{LOAD}$ is approximately equal to the rated load voltage $V_{RATED}$ of the electrical load 102 independent of the length of the load wiring 106 between the load regulation device 110 and the electrical load 102. The calibration may be automatic (e.g., during power-up of the load regulation device 110) or in response to an actuation event (e.g., the actuation of a button or reception of a digital message). The load regulation device 110 may be configured to gradually adjust (e.g., step up) the magnitude of the output voltage $V_{OUT}$ and subsequently receive external feedback that the magnitude of the load voltage $V_{LOAD}$ has reached or exceeded a predetermined level (e.g., the rated load voltage $V_{RATED}$ or a predetermined voltage $V_{PREDETERMINED}$ that is slightly below the rated voltage). In an example, the feedback may be provided by a device located near the electrical load 102 and capable of obtaining a fairly accurate reading of the load voltage $V_{LOAD}$ of the electrical load 102. In another example, the feedback may be provided by a device or circuit located inside the electrical load 102 and configured to measure the load voltage $V_{LOAD}$. The load regulation device 110 may be configured to use the feedback to determine the appropriate magnitude to which to control the output voltage $V_{OUT}$ so that the magnitude of the load voltage $V_{LOAD}$ may be approximately equal to the predetermined level (e.g., the rated load voltage $V_{RATED}$ of the electrical load 102 or a predetermined voltage $V_{PREDETERMINED}$) during normal operation.

The load regulation device 110 may be configured to measure the magnitudes of the output voltage $V_{OUT}$ and the load current $I_{LOAD}$ to determine a relationship between the output voltage $V_{OUT}$ and load current $I_{LOAD}$. For example, the load regulation device 110 may be configured to determine an I-V (current-voltage) curve of the output voltage $V_{OUT}$ and the load current LOAD (e.g., a plot of the current versus voltage at the output of the load regulation device 110). The load regulation device 110 may use the I-V curve to determine the magnitude of output voltage $V_{OUT}$ at which the magnitude of the load voltage $V_{LOAD}$ is approximately equal to the predetermined level (e.g., the rated load voltage $V_{RATED}$ or a predetermined voltage level $V_{PREDETERMINED}$).

The I-V curve or more broadly, the relationship between the output voltage $V_{OUT}$ and load current $I_{LOAD}$ may be saved to a storage device (e.g., a database device) so that similar determination may be made automatically during a subsequent power-up of the load regulation device 110.

The load control system 100 may comprise a calibration device 130 (e.g., a calibration circuit) coupled to (e.g., in parallel with) the electrical load 102 near (e.g., immediately adjacent to) the electrical load 102. The exact distance between the calibration device and the electrical load 202 may vary from one installation to the next, but it is contemplated that the calibration device 130 should be placed at a location that enables the calibration device 130 to fairly accurately measure and/or control one or more operating parameters of the electrical load 102 (e.g., without significant impact from the load wiring). For example, one or more components of the calibration device 130 may be configured to be connected in parallel with the electrical load 102 and to sense the magnitude of the load voltage $V_{LOAD}$ across the electrical load 102. For example, the calibration device 130 may be installed at a location that is within the final 5% of the load wiring leading to the electrical load 102.

In some examples, the calibration device 130 may be located at (e.g., being a part of) the electrical load 102. For instance, the electrical load 102 may comprise an enclosure and the calibration device 130 (e.g., a calibration circuit) may be installed inside the enclosure to measure and/or control one or more operating parameters of the electrical load 102.

Figure 2A:
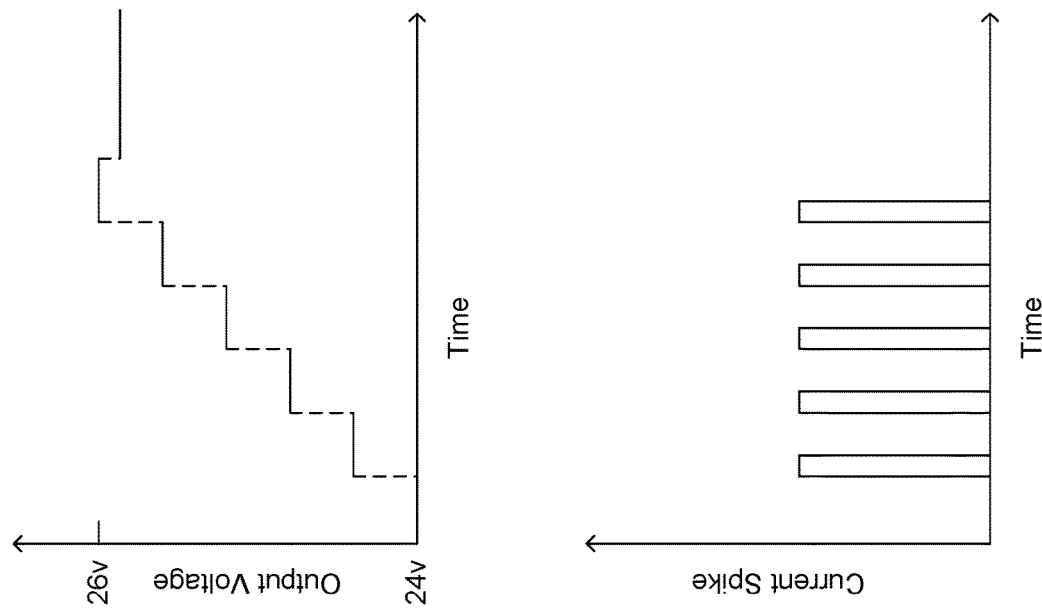
FIG. 2A is a simplified signal diagram of a first example feedback mechanism.
Figure 2B:
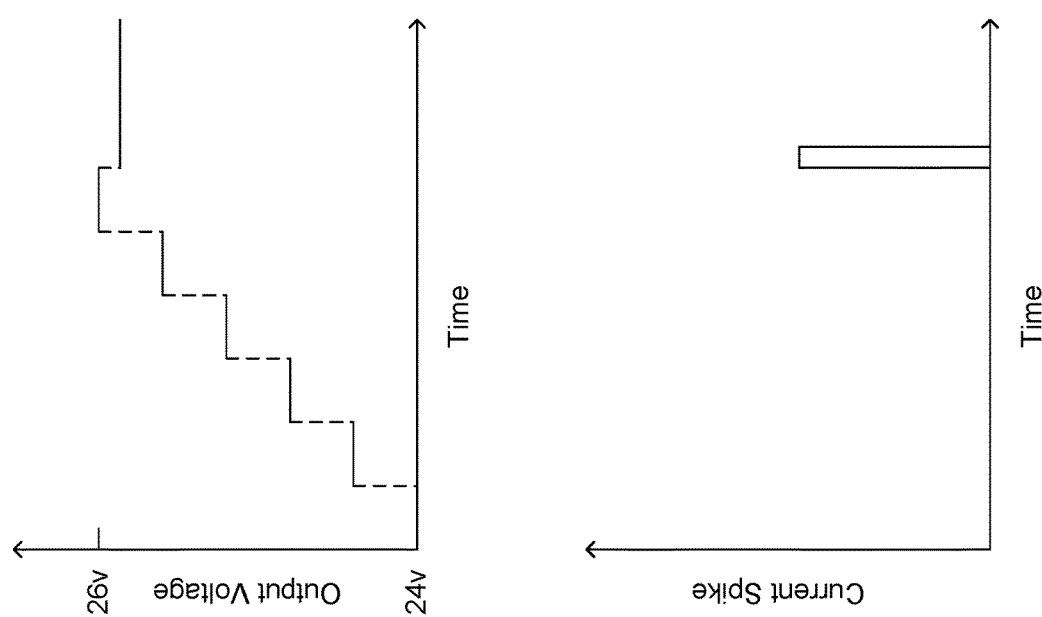
FIG. 2B is a simplified signal diagram of a second example feedback mechanism.

The calibration device 130 may be configured to provide feedback to the load regulation device 110 in response to sensing the magnitude of the load voltage $V_{LOAD}$. The load regulation device 110 may be configured to adjust the magnitude of the output voltage $V_{OUT}$ based on the feedback such that the load voltage $V_{LOAD}$ is substantially equal to or slightly less than the rated load voltage $V_{RATED}$. For example, the calibration device 130 may be configured to provide the feedback to the load regulation device 110 when the magnitude of the load voltage $V_{LOAD}$ has exceeded the predetermined level. The predetermined level $V_{PREDETERMINED}$ may be the rated load voltage $V_{RATED}$ (e.g., as shown in FIG. 2A) or a voltage level that is slightly below (e.g., by approximately 0.2 volt) the rated load voltage $V_{RATED}$ (e.g., as shown in FIG. 2B). The load regulation device 110 may be configured to gradually increase (e.g., step up) the magnitude of the output voltage $V_{OUT}$ until receiving the feedback from the calibration device 130 that the load voltage has exceeded the predetermined voltage $V_{PREDETERMINED}$. In some examples (e.g., when the predetermined voltage $V_{PREDETERMINED}$ is set to be equal to the rated load voltage $V_{RATED}$, as shown in FIG. 2A), after receiving the feedback that the load voltage has exceeded the predetermined level, the load regulation device 110 may be configured to slightly decrease (e.g., step down) the magnitude of the output voltage $V_{OUT}$ (e.g., by approximately 0.2 volt) to a final value (e.g., a normal operating output voltage) such that the magnitude of the load voltage $V_{LOAD}$ no longer exceeds the predetermined/rated level. In some examples (e.g., when the predetermined level $V_{PREDETERMINED}$ is set to be slightly below the rated load voltage $V_{RATED}$, as shown in FIG. 2B), after receiving the feedback that the load voltage has exceeded the predetermined level $V_{PREDETERMINED}$, the load regulation device 110 may be configured to maintain (e.g., without stepping down) the current magnitude of the output voltage $V_{OUT}$ as the final value (e.g., a value at which the magnitude of the load voltage $V_{LOAD}$ may be slightly above the predetermined level $V_{PREDETERMINED}$, but may still be below the rated load voltage $V_{RATED}$, as shown in FIG. 2B). The load regulation device 110 may comprise a memory and may be configured to store the final value of the output voltage $V_{OUT}$ in the memory for use during normal operation.

The calibration device 130 may be configured to provide the feedback to the load regulation device 110 via the load wiring 106. For example, as illustrated in FIG. 2A, the predetermined level $V_{PREDETERMINED}$ may be set to be equal to the rate voltage $V_{RATED}$. The calibration device 130 may be configured to generate a current spike (e.g., a current pulse) on the load wiring 106 when the load voltage has exceeded the predetermined level $V_{PREDETERMINED}$. The load regulation device 110 may be configured to gradually increase (e.g., through a plurality of periodic step) the magnitude of the output voltage $V_{OUT}$ until receiving the current spike. The load regulation device 110 may be further configured to decrease (e.g., step down) the output voltage $V_{OUT}$ slightly after receiving the current spike such that the magnitude of the load voltage $V_{LOAD}$ no longer exceeds the predetermined level $V_{PREDETERMINED}$ (or the rated voltage $V_{RATED}$). By way of another example, as illustrated in FIG. 2B, the predetermined level $V_{PREDETERMINED}$ may be set to be slightly below (e.g., by approximately 0.2 volt) the rate voltage $V_{RATED}$. The calibration device 130 may be configured to generate periodic (e.g., at regular intervals) current spikes on the load wiring when the magnitude of the load voltage $V_{LOAD}$ has not reached the predetermined level $V_{PREDETERMINED}$, and to stop generating the current spikes when the magnitude of the load voltage $V_{LOAD}$ has reached or exceeded the predetermined level $V_{PREDETERMINED}$. The load regulation device 110 may be configured to gradually increase (e.g., step up) the magnitude of the output voltage $V_{OUT}$ and to sense the current spikes indicating that the magnitude of the load voltage $V_{LOAD}$ has not reached the predetermined level $V_{PREDETERMINED}$. The load regulation device 110 may be further configured to maintain the magnitude of the output voltage $V_{OUT}$ after not sensing any current spike for a period longer than the regular interval. At the maintained output voltage level, the load voltage $V_{LOAD}$ may be equal to or slightly above the predetermined level $V_{PREDETERMINED}$, but may still be below the rated voltage $V_{RATED}$.

The magnitude of each gradual adjustment to the output voltage $V_{OUT}$ (e.g., the step size of the plurality of period steps shown in FIGS. 2A and 2B) may be determined based on one or more factors including, for example, the desired duration of the calibration process and/or fine tuning capabilities. For instance, where quick calibration is desirable, the magnitude (e.g., step size) of each adjustment may be set to a larger value; where fine turning is more important, the magnitude of each adjustment may be set to a smaller value. In an examples, a step size of approximately 0.2 volt may be used. In other examples, a different step size may be more suitable.

In addition to or in lieu of providing the feedback via one or more current spikes, the calibration device 130 may be configured to provide the feedback to the load regulation device 110 by wirelessly transmitting a digital message via the RF signal 108 or by transmitting a digital message on the load wiring 106 using, for example, a power-line communication (PLC) technology. Further, the calibration device 130 may be configured to provide the feedback to the load regulation device 110 by transmitting a digital message via another wired or wireless communication medium, such as, for example, infrared or optical communications. For example, the load regulation device 110 and the calibration device 130 may be configured to transmit and receive wireless signals according to a proprietary protocol (such as the Lutron ClearConnect protocol), or a standard protocol (such as one of WIFI, ZIGBEE, Z-WAVE, KNX-RF, ENOCEAN RADIO protocols, and the like). For example, the load regulation device 110 and the calibration device 130 may be configured to transmit and receive wireless signals using different wireless technologies, such as Bluetooth and/or near field communication (NFC) technologies.

In addition, the load regulation device 110 may be configured to receive the feedback via a wireless signal received from one of the input devices described herein. For example, where the electrical load 102 comprises an LED light source, the load regulation device 110 may be configured to determine that the light emitted by the LED light source may have reached or exceeded a predetermined level in response to a digital message received from the light sensor 120 via the RF signals 108. By way of another example, the load regulation device 110 may be configured to determine that the load voltage has reached or exceeded a predetermined level in response to a digital message received from a mobile communication device (e.g., a smart phone or a tablet). By way of yet another example, the load regulation system 100 may comprise a system controller that is configured to communicate (e.g., via a wired or wireless communication circuit) with both the calibration device 130 and the load regulation device 110. The calibration device 130 may be configured to communicate with (e.g., provide the feedback to) the system controller. The system control may then control the load regulation device 110 based on the communication with the calibration device 130.

In addition to or in lieu of providing an indication of whether the load voltage has reached or exceeded the predetermined level, the feedback described herein (e.g., a digital message) may include information regarding the actual magnitude of the load voltage and/or the discrepancy between the actual load voltage and the predetermined level. The load regulation device 110 may be configured to interpret the information included in the feedback and to adjust the output voltage $V_{OUT}$ based on the information so that the load voltage may be approximately equal to the predetermined level.

The load regulation device 110 and/or the calibration device 130 may be configured to initialize the calibration procedure. For example, the calibration procedure may be executed every time that the load regulation device 110 is powered up, or only the first (e.g., initial) time that the load regulation device 110 is powered up. The calibration procedure may be started by power cycling the load regulation device 110 and/or the calibration device 130 a number of times within a predetermined period of time, for example. The calibration procedure may be executed in response to the actuation of a button on the load regulation device 110 and/or the calibration device 130. The calibration procedure may be executed in response to a digital message received, for example, via the RF signals 108 or via another communication medium. The calibration procedure may be executed in response to any step change in the magnitude of the load current LOAD. Other ways to trigger the calibration procedure are also within the scope of this disclosure.

The load control system 100 may comprise one or more other types of load control devices, such as, for example, a dimming circuit for a lighting load, such as incandescent lamp or halogen lamp; an electronic dimming ballast for a fluorescent lamp; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; motorized interior or exterior shutters; a thermostat for a heating and/or cooling system; a temperature control device for controlling a setpoint temperature of an HVAC system; an air conditioner; a compressor; an electric baseboard heater controller; a controllable damper; a variable air volume controller; a fresh air intake controller; a ventilation controller; a hydraulic valves for use radiators and radiant heating system; a humidity control unit; a humidifier; a dehumidifier; a water heater; a boiler controller; a pool pump; a refrigerator; a freezer; a television or computer monitor; a video camera; an audio system or amplifier; an elevator; a power supply; a generator; an electric charger, such as an electric vehicle charger; and an alternative energy controller.

Figure 3:
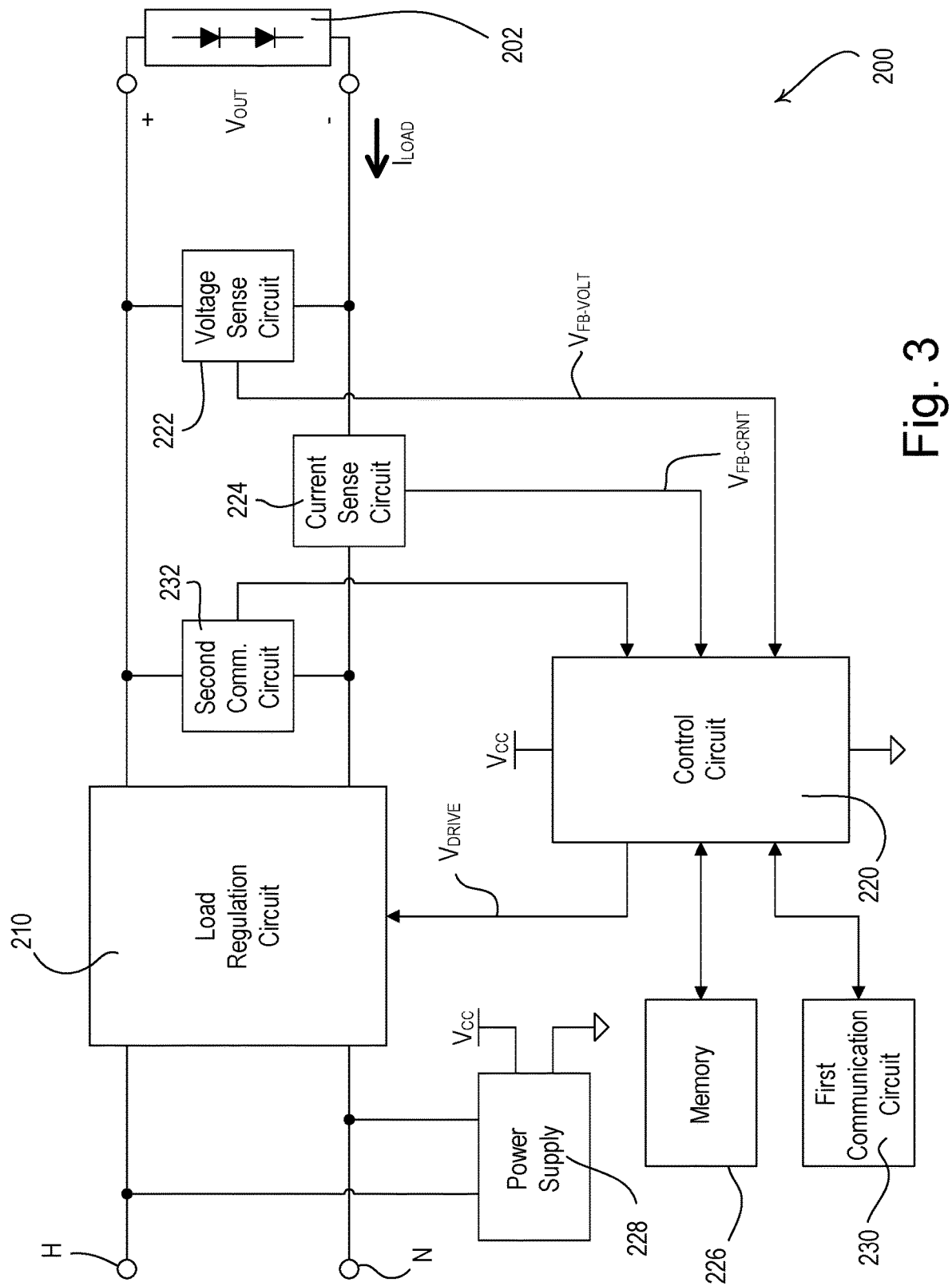
FIG. 3 is a simplified block diagram of a load regulation device, such as an LED driver, for controlling the intensity of an electrical load, such as an LED light source.

FIG. 3 is a simplified block diagram of a load regulation device 200 (e.g., an LED driver), which may be deployed as the load regulation device 110 in the load control system 100 shown in FIG. 1. The load regulation device 200 may be configured to control the amount of power delivered to an electrical load 202, such as, an LED light source, and to thus control certain functional aspects of the electrical load 202, such as, the intensity of the LED light source. The load regulation device 200 may comprise a hot terminal H and a neutral terminal that are adapted to be coupled to an alternating-current (AC) power source (e.g., the AC power source 104).

The load regulation device 200 may comprise a load regulation circuit 210, which may control the amount of power delivered to the electrical load 202. For example, where the electrical load 202 comprises an LED light source, the load regulation circuit 210 may control the intensity of the LED light source between a low-end (i.e., minimum) intensity $L_{EE}$ (e.g., approximately 1-5%) and a high-end (i.e., maximum) intensity $L_{HE}$ (e.g., approximately 100%) by pulse-width modulating or pulse-frequency modulating the output voltage $V_{OUT}$. The load regulation circuit 210 may comprise, for example, a forward converter, a boost converter, a buck converter, a flyback converter, a linear regulator, or any suitable LED drive circuit for adjusting the intensity of the LED light source. Examples of load regulation circuits for LED drivers are described in greater detail in commonly-assigned U.S. Pat. No. 8,492,987, issued Jul. 23, 2010, and U.S. Patent Application Publication No. 2014/0009085, filed Jan. 9, 2014, both entitled LOAD CONTROL DEVICE FOR A LIGHT-EMITTING DIODE LIGHT SOURCE, the entire disclosures of which are hereby incorporated by reference.

The load regulation device 200 may comprise a control circuit 220, e.g., a controller, for controlling the operation of the load regulation circuit 210. The control circuit 220 may comprise, for example, a digital controller or any other suitable processing device, such as, for example, a microcontroller, a programmable logic device (PLD), a microprocessor, an application specific integrated circuit (ASIC), or a field-programmable gate array (FPGA).

The control circuit 220 may generate a drive control signal $V_{DRIVE}$ that is provided to the load regulation circuit 210 for adjusting the magnitude of an output voltage $V_{OUT}$ (to thus adjust the magnitude of a load voltage $V_{LOAD}$ generated across the electrical load 202) and/or the magnitude of a load current $I_{LOAD}$ conducted through the electrical load 202 (to thus control the intensity of an LED light source to a target intensity $L_{TRGT}$, for example). The load regulation device 200 may further comprise a voltage sense circuit 222 (which may be configured to generate an output voltage feedback signal $V_{FB-VOLT}$ that may indicate the magnitude of the output voltage $V_{OUT}$) and a current sense circuit 224 (which may be configured to generate a load current feedback signal $V_{FB-CRNT}$ that may indicate the magnitude of the load current $I_{LOAD}$). The control circuit 220 may receive the voltage feedback signal $V_{FB-VOLT}$ and the load current feedback signal $V_{FB-CRNT}$, and control the drive control signal $V_{DRIVE}$ to adjust the magnitude of the output voltage $V_{OUT}$ and/or the magnitude of the load current $I_{LOAD}$ (e.g., to thus control the intensity of the LED light source to the target intensity $L_{TRGT}$) using a control loop.

The control circuit 220 may be coupled to a storage device (e.g., a memory 226) for storing the operational characteristics of the load regulation device 200 (e.g., the target intensity $L_{TRGT}$, the low-end intensity $L_{EE}$, the high-end intensity $L_{HE}$, etc., of an LED light source). The load regulation device 200 may further comprise a power supply 228, which may generate a direct-current (DC) supply voltage $V_{CC}$ for powering the circuitry of the load regulation device 200.

The load regulation device 200 may also comprise a first communication circuit 230, which may be coupled to, for example, a wired communication link or a wireless communication link, such as a radio-frequency (RF) communication link or an infrared (IR) communication link. The control circuit 220 may be configured to update the operational characteristics (e.g., the target intensity $L_{TRGT}$ of an LED light source) stored in the memory 226 in response to digital messages received via the first communication circuit 230. In addition to or in lieu of receiving digital messages via the first communication circuit 230, the load regulation device 200 may be configured to receive a signal (e.g., a phase-control signal) from one of the input devices described herein (e.g., a dimmer switch) for determining the operational characteristics of the electrical load 202 (e.g., the target intensity $L_{TRGT}$ for the LED light source).

The control circuit 220 may be configured to automatically calibrate the magnitude of the output voltage $V_{OUT}$, such that the magnitude of the load voltage $V_{LOAD}$ across the electrical load 202 is approximately equal to the rated load voltage $V_{RATED}$ of the electrical load 202. For example, during a calibration mode, the control circuit 220 may be configured to periodically increase the magnitude of the output voltage $V_{OUT}$ by a voltage step $\Delta_{OUT}$ and subsequently receive feedback that the load voltage $V_{LOAD}$ has reached or exceeded a predetermined level (e.g., has reached and/or exceeded the rated load voltage $V_{RATED}$ of the electrical load 202). In other words, the control circuit 220 may be configured to gradually increase (e.g., through a plurality of periodic steps) the magnitude of the output voltage $V_{OUT}$ until the control circuit 220 receives the feedback that the magnitude of the load voltage $V_{LOAD}$ has reached or exceeded the predetermined level. The control circuit 220 may decrease the magnitude of the output voltage $V_{OUT}$ by a certain amount (e.g., the voltage step $\Delta_{OUT}$) after receiving the feedback such that the output voltage $V_{OUT}$ may reach a final magnitude at which the load voltage $V_{LOAD}$ no longer exceeds the predetermined level. The final magnitude of the output voltage $V_{OUT}$ may be stored in the memory 226 and used by the control circuit to control the magnitude of the output voltage $V_{OUT}$ to the stored magnitude during normal operation.

By way of another example, during the calibration mode, the control circuit 220 may be configured to increase (e.g., step up by a voltage step $\Delta_{OUT}$) the magnitude of the output voltage $V_{OUT}$ and to sense regular-interval feedback that the load voltage $V_{LOAD}$ has not reached the predetermined level (e.g., has not reached or exceeded the rated load voltage $V_{RATED}$ of the electrical load 202). Subsequently, when no feedback is received for a period longer than the regular interval, the control circuit 220 may be configured to decrease the magnitude of the output voltage $V_{OUT}$ by a certain amount (e.g., the voltage step $\Delta_{OUT}$) or to maintain magnitude of the output voltage $V_{OUT}$. The final magnitude of the output voltage may be stored in memory 226. The control circuit 220 may be configured to control the magnitude of the output voltage $V_{OUT}$ to the stored final magnitude during normal operation.

The control circuit 220 may be configured to gradually adjust the magnitude of the output voltage $V_{OUT}$, measure the magnitude of the output voltage $V_{OUT}$ (e.g., via the voltage sense circuit 222) and/or the magnitude of the load current $I_{LOAD}$ (e.g., via the current sense circuit 224), and store these values in the memory 226. The control circuit 220 may then be configured to determine a relationship between the output voltage $V_{OUT}$ and the load current LOAD (e.g., an I-V curve of the output voltage and the load current). The control circuit 210 may be configured to use the relationship between the output voltage $V_{OUT}$ and the load current $I_{LOAD}$ to determine the magnitude of output voltage $V_{OUT}$ at which the magnitude of the load voltage $V_{LOAD}$ is approximately equal to the rated load voltage $V_{RATED}$, and may store that magnitude in the memory 226.

The control circuit 220 may also be configured to receive the feedback that the load voltage has reached or exceeded the predetermined level in one or more digital messages received via the first communication circuit 230. For example, the control circuit 210 may be configured to receive a digital message from a calibration device (e.g., the calibration device 130 shown in FIG. 1) indicating that the magnitude of the load voltage $V_{LOAD}$ has reached the predetermined level. The calibration device may be coupled to the electrical load 202 (e.g., one or more components of the calibration device may be connected in parallel with the electrical load 202) near (e.g., immediately adjacently to) the electrical load 202. The exact distance between the calibration device and the electrical load 202 may vary from one installation to the next, but it is contemplated that the calibration device 130 should be placed at a location that enables the calibration device to fairly accurately measure and/or control one or more operating parameters of the electrical load 202 (e.g., without significant impact from the load wiring). In some examples, the calibration device may be located at (e.g., being a part of) the electrical load 202. For instance, the electrical load 202 may comprise an enclosure and the calibration device (e.g., a calibration circuit) may be installed inside the enclosure to measure and/or control one or more operating parameters of the electrical load 202. Further, where the electrical load 202 comprises an LED light source, the control circuit 220 may be configured to receive a digital message indicating that the light emitted by the LED light source may have reached or exceeded a predetermined level from a light sensor (e.g., the light sensor 120 shown in FIG. 1).

In addition to or in lieu of providing an indication of whether the load voltage has reached the predetermined level, the feedback (e.g., one or more digital messages) described herein may include information regarding the actual magnitude of the load voltage and/or the discrepancy between the load voltage and the predetermined level. The control circuit 220 (e.g., a microprocessor) may be configured to interpret the information included in the feedback and to adjust the output voltage $V_{OUT}$ based on the information so that the load voltage may be approximately equal to the predetermined level.

The load regulation device 200 may further comprise a second communication circuit 232 coupled to the load wiring to the electrical load 202 (e.g., the load wiring 106 shown in FIG. 1). The second communication circuit may be configured to receive feedback from a calibration device coupled to (e.g., in parallel with) the electrical load (e.g., the calibration device 130) via the load wiring. For example, the second communication circuit 232 may be configured to receive a digital message from the calibration device via the load wiring, e.g., a power-line communication (PLC) signal. In addition to or in lieu of receiving the digital message, the second communication circuit 232 may be configured to receive one or more current spikes (e.g., current pulses) indicating whether the magnitude of the load voltage $V_{LOAD}$ has reached or exceeded the predetermined level. In one or more examples, the load regulation device 200 may not comprise the second communication circuit 232, and the control circuit 210 may be configured to receive the current spikes from the calibration device via the voltage sense circuit 222 and/or the current sense circuit 224.

Figure 4A:
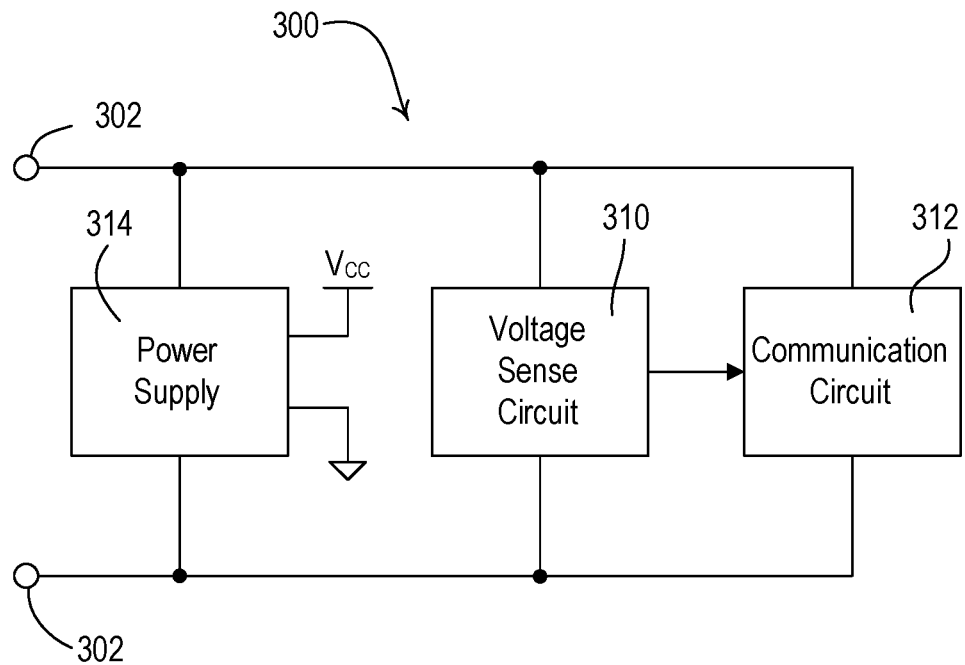
FIG. 4A is a first simplified block diagram of a calibration device that may be used to calibrate an output voltage of a load regulation device.
Figure 4B:
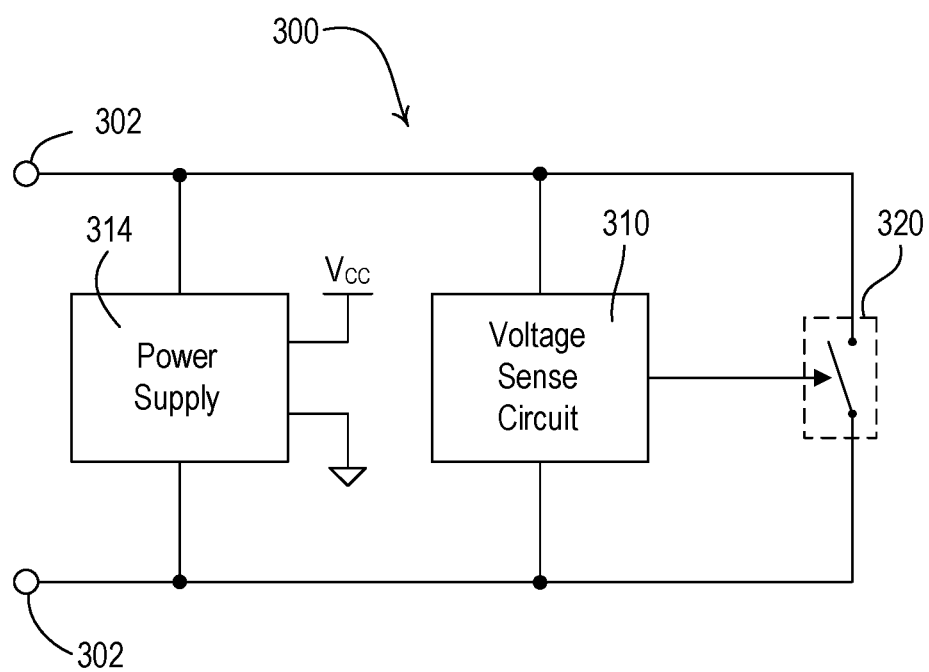
FIG. 4B is a second simplified block diagram of a calibration device that may be used to calibrate an output voltage of a load regulation device.
Figure 4C:
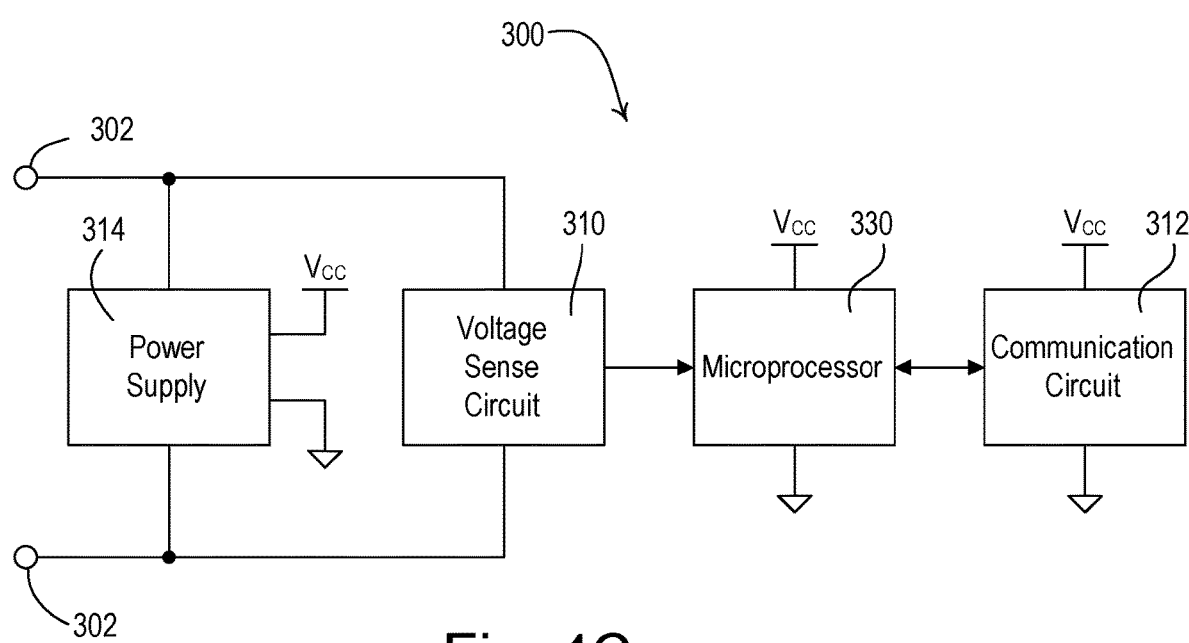
FIG. 4C is a third simplified block diagram of a calibration device that may be used to calibrate an output voltage of a load regulation device.

FIGS. 4A-4C are simplified block diagrams of example calibration devices (e.g., calibration circuits) 300, 320, 340, which may be deployed as the calibration device 130 in the load control system 100 shown in FIG. 1. The calibration devices 300, 320, 340 may each be configured to be coupled to (e.g., in parallel with) an electrical load (e.g., the LED light source described herein) near the electrical load. The calibration devices 300, 320, 340 may comprise electrical terminals 302, 322, 342 (e.g., screw terminals, flying leads, etc.), respectively, that are configured to be coupled to load wiring between the electrical load and a load regulation device (e.g., the load wiring 106). The calibration devices 300, 320, 340 may comprise voltage sense circuits 304, 324, 344, respectively. The voltage sense circuits 304, 324, 344 may be coupled between their corresponding terminals (e.g., terminals 302, 322, 342) and be responsive to the magnitude of the load voltage $V_{LOAD}$ at the electrical load. One or more of the calibration devices 300, 320, 340 may also comprise a communication circuit (e.g., the communication circuit 306, 326, or 346) for providing feedback concerning whether the load voltage $V_{LOAD}$ has reached or exceeded a predetermined level, the actual magnitude of the load voltage $V_{LOAD}$, and/or the discrepancy between the magnitude of the load voltage $V_{LOAD}$ and the predetermined level.

The voltage sense circuits 304, 324, 344, and the communication circuits 306, 326, 346 may comprise analog and/or digital circuits. For example, the voltage sense circuit 324 may comprise a shunt regulator and the communication circuit 326 may comprise a current sink circuit (e.g., including a field-effect transistor (FET) as shown in FIG. 4B) configured to conduct one or more pulses of current through the load wiring based on indications provided by the shunt regulator concerning whether the magnitude of the load voltage $V_{LOAD}$ has exceeded the predetermined level. By way of another example, one or more of the voltage sense circuits 304, 324, 344 may comprise a voltage divider coupled between the corresponding terminals for generating a scaled voltage that is proportional to the magnitude of the load voltage $V_{LOAD}$ and a digital controller configured to sense the scaled voltage. The digital controller may be further configured to determine the magnitude of the load voltage $V_{LOAD}$ and/or whether the magnitude of the load voltage $V_{LOAD}$ has reached or exceeded the predetermined level. For example, the digital controller may be configured to sample the scaled voltage using an analog-to-digital converter (ADC), derive the magnitude of the load voltage $V_{LOAD}$ based on the scaled voltage, and/or determine whether the magnitude of the load voltage $V_{LOAD}$ has reached or exceeded the predetermined level. The communication circuits described herein may comprise a digital communication circuit for transmitting a digital message via a wired or wireless communication link in response to the digital controller of the voltage sense circuit determining the magnitude of the load voltage $V_{LOAD}$ and/or whether the magnitude of the load voltage $V_{LOAD}$ has exceeded the predetermined level. For example, the digital message may comprise data fields representing the magnitude of the load voltage $V_{LOAD}$, the discrepancy between the magnitude of the load voltage $V_{LOAD}$ and the predetermined level, and/or an indication of whether the magnitude of the load voltage $V_{LOAD}$ has reached or exceeded the predetermined level. Either or both of the digital controller and the communication circuit may comprise, for example, a digital processing device 348 (e.g., as shown in FIG. 4C), which may be a microcontroller, a programmable logic device (PLD), a microprocessor, an application specific integrated circuit (ASIC), a field-programmable gate array (FPGA), or any other suitable processing device. The digital processing device 348 may be a part of the voltage sense circuit 344 or a stand-alone device (e.g., as shown in FIG. 4C) comprised within the calibration device (e.g., the calibration device 340) and having interface(s) to either or both of the voltage sensing circuit and the communication circuit. The various components of the calibration device (e.g., the calibration device 300, 320, or 340) may be powered by a same power supply (e.g., the power supply 309, 329, or 349). Alternatively, separate power supplies may be provided for one or more components of the calibration device.

Figure 5:
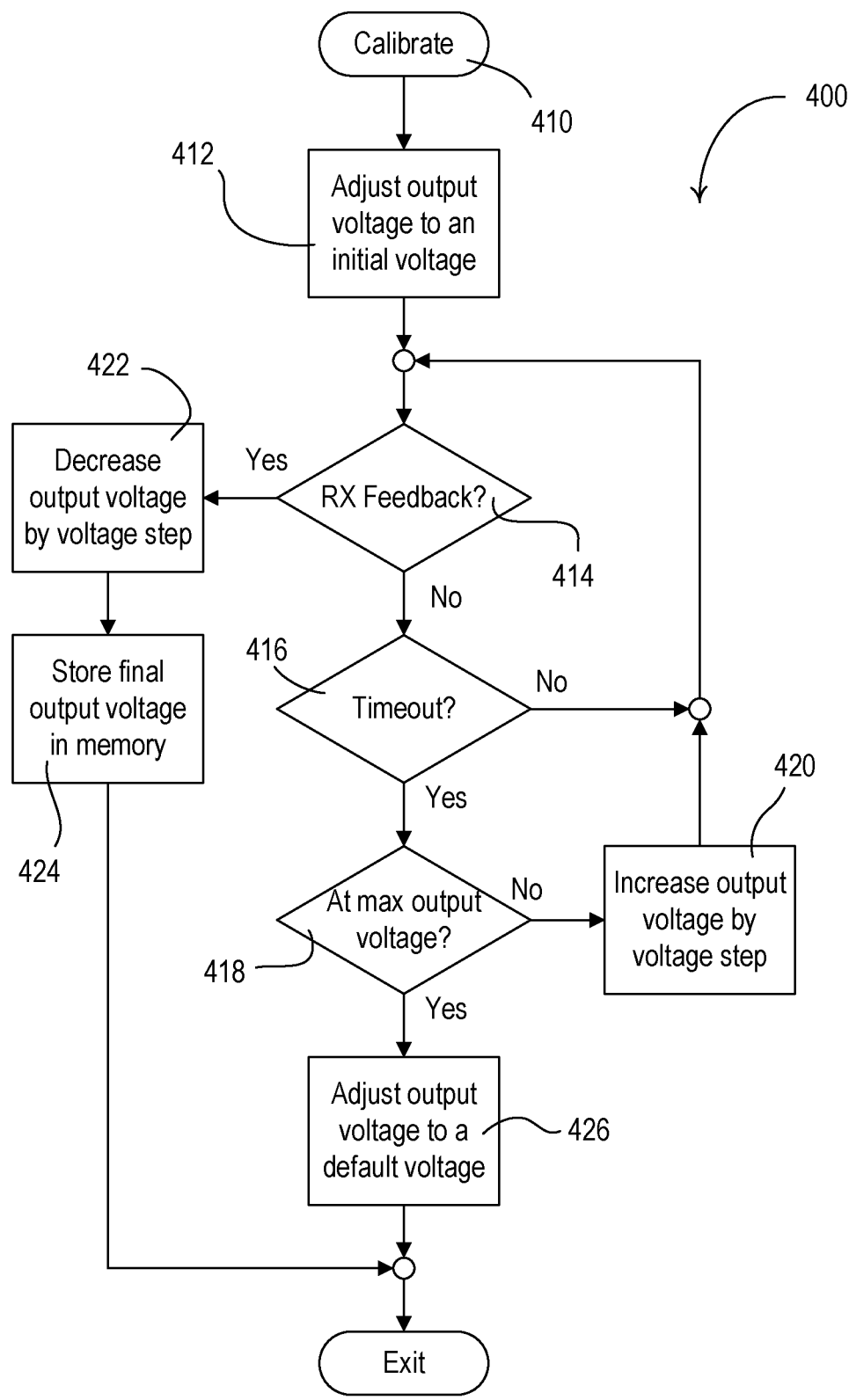
FIG. 5 is a first simplified flowchart of an example calibration procedure for calibrating a load voltage across an electrical load.

FIG. 5 is a simplified flowchart of an example calibration procedure 400 that may be executed by a control circuit of a load regulation device (e.g., a control circuit of the load regulation device 110 of FIG. 1 and/or the control circuit 220 of the load regulation device 200 of FIG. 3). For example, the calibration procedure 400 may be executed when the load regulation device is powered up at step 410. The calibration procedure 400 may also be executed in response to the actuation of a button of the load regulation device and/or in response to a digital message received by the load regulation device at step 410. The control circuit may first adjust the magnitude of the output voltage $V_{OUT}$ of the load regulation device to an initial output voltage $V_{INIT}$ (e.g., at approximately the rated voltage $V_{RATED}$ of an electrical load) at step 412. The control circuit may then wait to receive feedback (e.g., a digital message or a current spike indicating whether the load voltage $V_{LOAD}$ has exceeded a predetermined level) at step 414 until a timeout (e.g., approximately one second) expires at step 416.

If the control circuit has not received feedback at step 414 when the timeout expires at step 416, the control circuit may then determine if the magnitude of the output voltage $V_{OUT}$ has reached a maximum output voltage $V_{MAX}$, which may be, for example, approximately 20% greater than the rated voltage $V_{RATED}$ of the electrical load (e.g., $V_{MAX}=1.2 \cdot V_{RATED}$) at step 418. If the magnitude of the output voltage has not exceeded the maximum output voltage $V_{MAX}$ at step 418, the control circuit may increase the magnitude of the output voltage $V_{OUT}$ by a voltage step $\Delta_{OUT}$ (e.g., approximately 0.2 volt) at step 420, before the control circuit once again waits to see if feedback has been received at steps 414 and 416. When the control circuit receives feedback (e.g., that the load voltage $V_{LOAD}$ has exceeded the predetermined level) at step 414, the control circuit may decrease the output voltage $V_{OUT}$ slightly (e.g., by the voltage step $\Delta_{OUT}$ at step 422) and store the final value of the output voltage $V_{OUT}$ in memory at step 424, before the calibration procedure 400 exits. When the control circuit determines that the magnitude of the output voltage $V_{OUT}$ has reached the maximum output voltage $V_{MAX}$ at step 418, the control circuit may adjust the magnitude of the output voltage $V_{OUT}$ to a default voltage (e.g., approximately equal to the rated voltage) at step 426 and the calibration procedure 400 exits.

Figure 6:
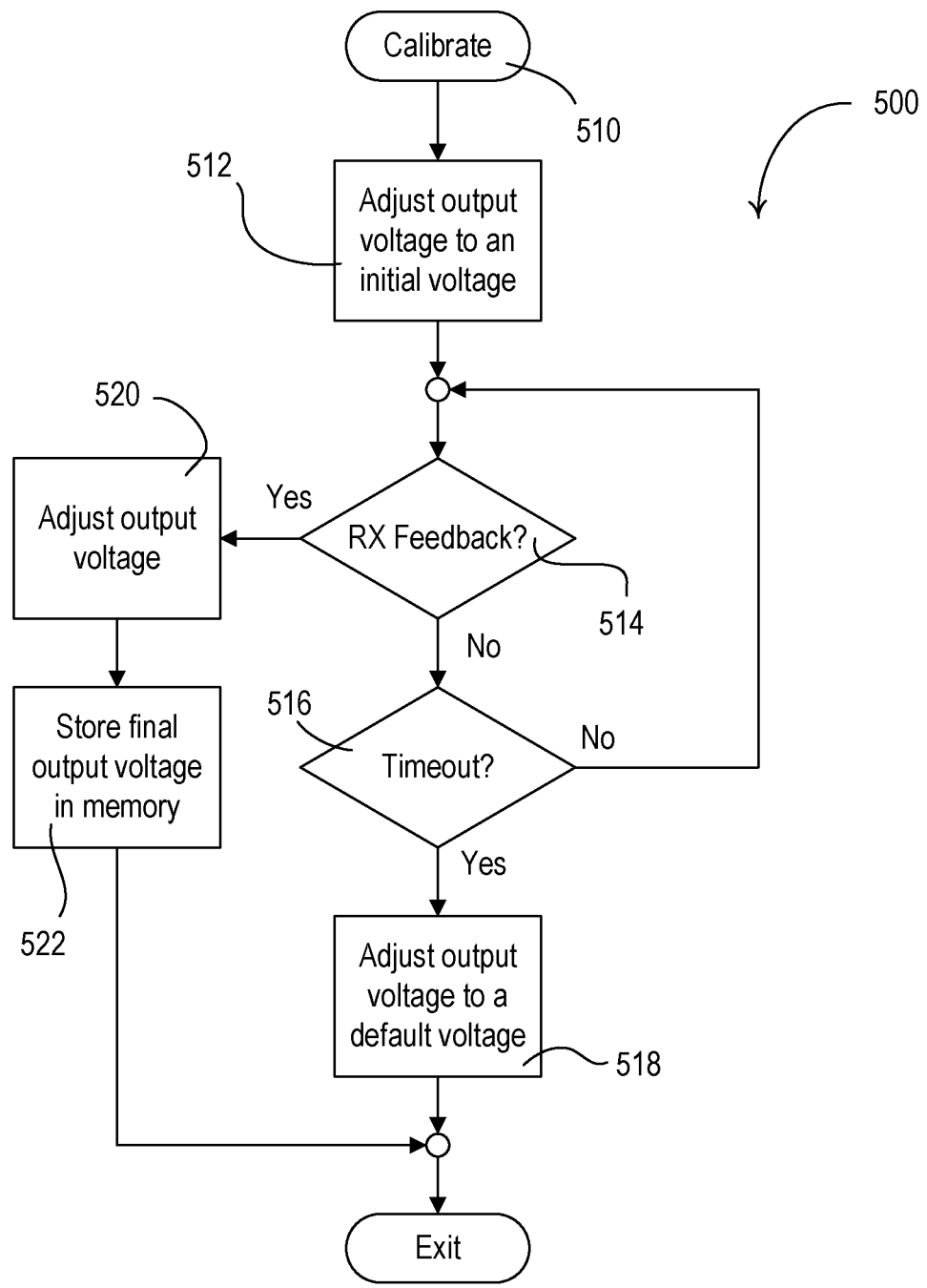
FIG. 6 is a second simplified flowchart of an example calibration procedure for calibrating a load voltage across an electrical load.

In lieu of gradually adjusting the output voltage $V_{OUT}$ (e.g., through a plurality of period steps $\Delta_{OUT}$) until receiving feedback indicating that the load voltage $V_{LOAD}$ has reached or exceeded a predetermined level, the control circuit may be configured to apply (e.g., all at once) a specific amount of adjustment to the magnitude of the output voltage $V_{OUT}$ based on information contained in the feedback (e.g., a digital message indicating the discrepancy between the load voltage $V_{LOAD}$ and the predetermined level). FIG. 6 illustrates such an example calibration procedure 500. For example, the calibration procedure 500 may be executed when the load regulation device is powered up at step 510. The calibration procedure 500 may also be executed in response to the actuation of a button of the load regulation device and/or in response to a digital message received by the load regulation device at step 510. The control circuit may first adjust the magnitude of the output voltage $V_{OUT}$ of the load regulation device to an initial output voltage $V_{INIT}$ (e.g., at approximately the rated voltage $V_{RATED}$ of an electrical load) at step 512. The control circuit may then wait to receive feedback at step 514 until a timeout (e.g., approximately one second) expires at step 516. The feedback may comprise a digital message indicating the magnitude of the load voltage $V_{LOAD}$ and/or the discrepancy between the load voltage $V_{LOAD}$ and the predetermined level. The control circuit may be configured to use the feedback information to determine and apply, at step 520, an adjustment (e.g., an increase, a decrease, or no adjustment) to the output voltage $V_{OUT}$ such that the load voltage $V_{LOAD}$ may reach approximately the predetermined level. The maximum amount of adjustment may be capped at a certain level to ensure that the output voltage $V_{OUT}$ does not exceed a maximum output voltage $V_{MAX}$, which may be, for example, approximately 20% greater than the rated voltage $V_{RATED}$ of the electrical load (e.g., $V_{MAX}=1.2 \cdot V_{RATED}$). If, at step 514, the control circuit does not receive any feedback when the timeout expires at step 516, the control circuit may adjust the magnitude of the output voltage $V_{OUT}$ to a default voltage (e.g., approximately equal to the rated voltage) at step 518 and the calibration procedure 500 exits.

Figure 7:
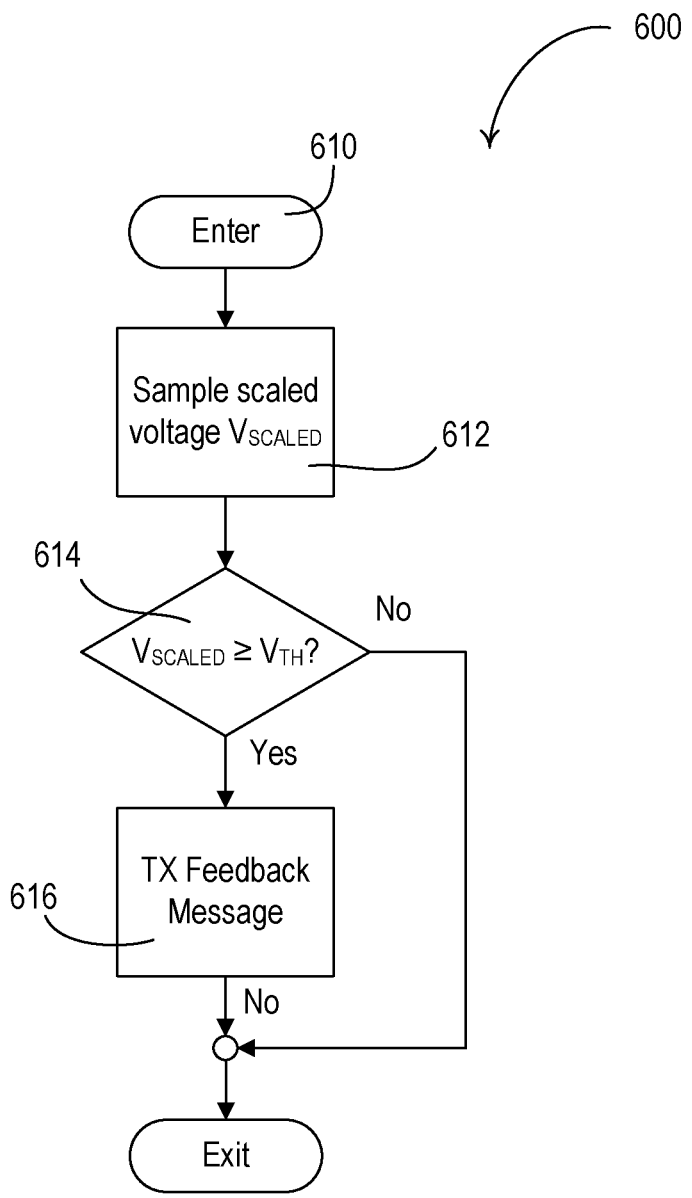
FIG. 7 is a simplified flowchart of an example feedback procedure executed while calibrating a load voltage across an electrical load.

FIG. 7 is a simplified flowchart of an example feedback procedure 600 executed by a control circuit of a calibration device (e.g., a control circuit of the calibration device 130 shown in FIG. 1 and/or the digital controller of the calibration devices 300, 320, 340 shown in FIGS. 4A-4C) while calibrating a load voltage $V_{LOAD}$ across an electrical load (e.g., an LED light source). For example, the feedback procedure 600 may be executed periodically (e.g., once a day) at step 610. The period at which the feedback procedure 600 is executed may be configured by a user. At step 612, the control circuit may sample a scaled voltage having a magnitude that is proportional to the magnitude of the load voltage $V_{LOAD}$ across the electrical load (e.g., an LED light source). If the magnitude of the scaled voltage $V_{SCALED}$ is greater than or equal to a threshold voltage $V_{TH}$ indicating that the magnitude of the load voltage has reached or exceeded a predetermined voltage (e.g., the rated voltage of the LED light source) at step 614, the control circuit may provide feedback (e.g., via a digital message or a current spike) at step 616, before the feedback procedure 600 exits. If the magnitude of the scaled voltage $V_{SCALED}$ is less than the threshold voltage $V_{TH}$ at step 614, the feedback procedure 600 simply exits without feedback being provided.

In lieu of comparing $V_{SCALED}$ to $V_{TH}$, and determining whether the magnitude of the load voltage has reached or exceeded the predetermined voltage at step 614, the control circuit may be configured to determine the actual magnitude of the load voltage $V_{LOAD}$ and/or the discrepancy between the load voltage $V_{LOAD}$ and the predetermined level at step 614. The control circuit may then provide feedback (e.g., via a digital message) at step 616 concerning the actual magnitude of the load voltage, before the feedback procedure 600 exits.

Figure 8:
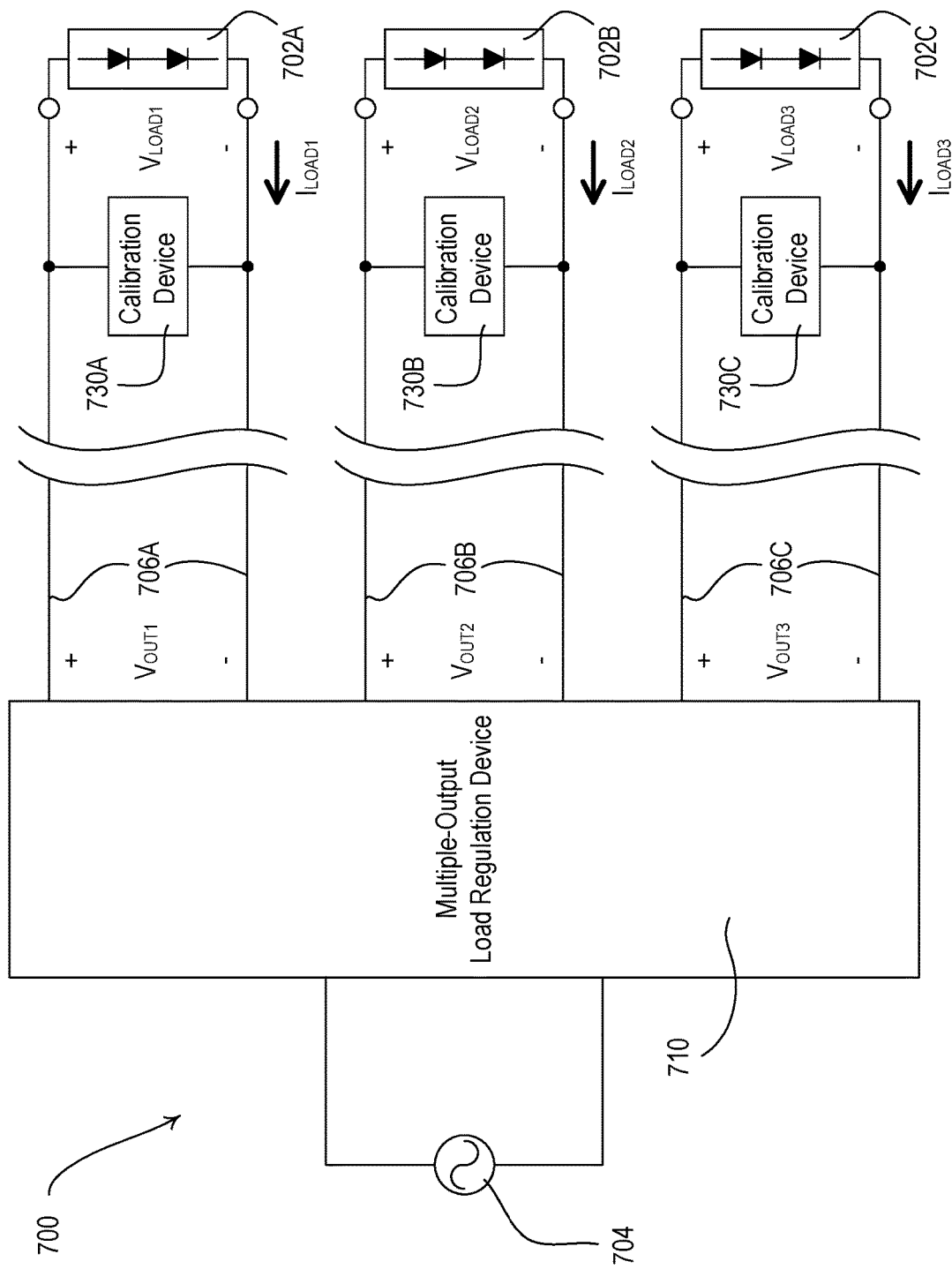
FIG. 8 is a simplified block diagram of an example load control system having a multiple-output load regulation device for controlling the amount of power delivered a plurality of electrical loads.

FIG. 8 is a simplified block diagram of an example load control system 700 having a multiple-output load regulation device 710 (e.g., an LED driver) for controlling the amount of power delivered to a plurality of electrical loads 702A, 702B, 702C (e.g., LED light sources). The multiple-output load regulation device 710 may be coupled to a power source, e.g., an AC power source 704 (as shown in FIG. 8) or a DC power source. The electrical loads 702A, 702B, 702C may each be characterized by a respective rated load voltage (e.g., approximately 24 volts for an LED light source). The multiple-output load regulation device 710 may generate multiple output voltages $V_{OUT1}$, $V_{OUT2}$, $V_{OUT3}$, which may be coupled to the respective electrical loads 702A, 702B, 702C via respective runs of load wiring 706A, 706B, 706C. To generate the multiple output voltages $V_{OUT1}$, $V_{OUT2}$, $V_{OUT3}$, the multiple-output load regulation device 710 may comprise multiple load regulation circuits (not shown), e.g., each similar to the load regulation circuit 210 of the load regulation device 200 of FIG. 3.

Each electrical load 702A, 702B, 702C may develop a respective load voltage $V_{LOAD1}$, $V_{LOAD2}$, $V_{LOAD3}$, and may conduct a respective load current $I_{LOAD1}$, $I_{LOAD2}$, $I_{LOAD3}$. Where the electrical loads 702A, 702B, 702C comprise LED light sources, the load regulation device 710 may be configured to individually turn each of the LED light sources on and off. The multiple-output load regulation device 710 may be further configured to individually adjust the intensity of each of the LED light sources between a minimum intensity (e.g., approximately 1%) and a maximum intensity (e.g., approximately 100%). The load regulation device 710 may be configured to pulse-width modulate or pulse-frequency modulate each of the output voltages $V_{OUT1}$, $V_{OUT2}$, $V_{OUT3}$ to adjust the intensity of the respective LED light source between the minimum and maximum intensities, e.g., by adjusting the duty cycle or frequency of the output voltage, respectively. The load regulation device 710 may be configured to receive wireless signals (e.g., RF signals) from one or more input devices (not shown) as described herein, and to control the electrical loads 702A, 702B, 702C in response to the received wireless signals.

Because the lengths of the respective runs of load wiring 706A, 706B, 706C between the multiple-output load regulation device 710 and the respective electrical loads 702A, 702B, 702C may be different, the magnitudes of the respective load voltages $V_{LOAD1}$, $V_{LOAD2}$, $V_{LOAD3}$ at the electrical loads 702A, 702B, 702C may be different and may differ from the magnitudes of the respective output voltages $V_{OUT1}$, $V_{OUT2}$, $V_{OUT3}$ at the load regulation device 710. The multiple-output load regulation device 710 may be configured to execute a calibration procedure (e.g., the calibration procedure 400 or 500 shown in FIGS. 5-6) for one or more of the output voltages $V_{OUT1}$, $V_{OUT2}$, $V_{OUT3}$. If the electrical loads 702A, 702B, 702C all have the same rated voltage, the multiple-output load regulation device 710 may be configured to automatically calibrate the magnitude of one or more of the output voltages $V_{OUT1}$, $V_{OUT2}$, $V_{OUT3}$, such that the magnitudes of the load voltages $V_{LOAD1}$, $V_{LOAD2}$, $V_{LOAD3}$ may all be approximately equal to the rated voltage of the electrical loads. If the electrical loads 702A, 702B, 702C have different rated voltages, the multiple-output load regulation device 710 may be configured to automatically calibrate the magnitude of one or more of the output voltages $V_{OUT1}$, $V_{OUT2}$, $V_{OUT3}$ such that the magnitudes of the load voltages $V_{LOAD1}$, $V_{LOAD2}$, $V_{LOAD3}$ may be approximately equal to the respective rated voltage.

The load control system 700 may comprise multiple calibration devices 730A, 730B, 730C coupled to (e.g., in parallel with) the respective electrical loads 702A, 702B, 702C near (e.g., immediately adjacent to) the electrical loads. The exact distance between each calibration device and the corresponding electrical load may vary from one installation to the next, but it is contemplated that the calibration device should be placed at a location that enables the calibration device to fairly accurately measure and/or control one or more operating parameters of the electrical load (e.g., without significant impact from the load wiring). In some examples, the calibration devices 730A, 730B, 730C may each be located at (e.g., being a part of) the electrical load. For instance, the electrical load may comprise an enclosure and the calibration device (e.g., a calibration circuit) may be installed inside the enclosure to measure and/or control one or more operating parameters of the electrical load. The calibration devices 730A, 730B, 730C may each be similar to the calibration devices 300, 320, 340 shown in FIGS. 4A-4C. The calibration devices 730A, 730B, 730C may each be configured to sense the magnitude of the respective load voltage $V_{LOAD1}$, $V_{LOAD2}$, $V_{LOAD3}$ across the adjacent electrical load 702A, 702B, 702C and provide feedback to the load regulation device 710 in response to sensing magnitude of the load voltage. For example, during the calibration procedure, the multiple-output load regulation device 710 may be configured to gradually increase (e.g., step up) the magnitude of each of the output voltages $V_{OUT1}$, $V_{OUT2}$, $V_{OUT3}$ until the load regulation device 710 receives the feedback from the respective calibration device 730A, 730B, 730C that the respective load voltage $V_{LOAD1}$, $V_{LOAD2}$, $V_{LOAD3}$ has exceeded the predetermined level. For example, the calibration devices 730A, 730B, 730C may be configured to provide the feedback to the load regulation device 710 when the magnitude of the respective load voltage $V_{LOAD1}$, $V_{LOAD2}$, $V_{LOAD3}$ exceeds a predetermined level (e.g., the rated load voltage). After receiving the feedback from one of the calibration devices 730A, 730B, 730C that the magnitude of the respective load voltage $V_{LOAD1}$, $V_{LOAD2}$, $V_{LOAD3}$ has exceeded the predetermined level, the load regulation device 710 may be configured to decrease (e.g., step down) the magnitude of the respective output voltage $V_{OUT1}$, $V_{OUT2}$, $V_{OUT3}$ slightly (e.g., such that the magnitude of the load voltage no longer exceeds the predetermined level).

In addition to or in lieu of providing feedback that the respective load voltage $V_{LOAD1}$, $V_{LOAD2}$, $V_{LOAD3}$ has reached the predetermined level, the calibration devices 730A, 730B, 730C may be configured to provide information to the load regulation device 710 regarding the actual magnitude of the load voltage $V_{LOAD1}$, $V_{LOAD2}$, $V_{LOAD3}$ and/or the discrepancy between the load voltage $V_{LOAD1}$, $V_{LOAD2}$, $V_{LOAD3}$ and the predetermined level. The load regulation device 710 may be configured to interpret the information provided and to adjust the magnitude of the respective output voltage $V_{OUT1}$, $V_{OUT2}$, $V_{OUT3}$ in accordance with the information such that the load voltage $V_{LOAD1}$, $V_{LOAD2}$, $V_{LOAD3}$ may be approximately equal to the predetermined level.

The load regulation device 710 may be configured to store the final value of one or more of the output voltages $V_{OUT1}$, $V_{OUT2}$, $V_{OUT3}$ in memory for use during normal operation. As a result of executing the calibration procedures, the multiple-output load regulation device 710 may control the output voltages $V_{OUT1}$, $V_{OUT2}$, $V_{OUT3}$ to different magnitudes.

The calibration devices 730A, 730B, 730C may be configured to provide the feedback in different ways. For example, the calibration devices 730A, 730B, 730C may be configured to send the feedback to the multiple-output load regulation device 710 by wirelessly transmitting the feedback via wireless signals (e.g., RF signals, infrared signals, or optical signals). In addition, the calibration devices 730A, 730B, 730C may be configured to transmit the feedback to the load regulation device 710 via the respective runs of load wiring 706A, 706B, 706C, e.g., by generating one or more current spikes (e.g., current pulses) on the load wiring or by transmitting a digital message using a power-line communication (PLC) technology. Further, the load regulation device 710 may be configured to receive the feedback in response to a wireless signal received from one or more input devices (e.g., one or more daylight sensors where the electrical loads include LED light sources). The load regulation device 710 may also be configured to measure the magnitudes of one or more of the output voltages $V_{OUT1}$, $V_{OUT2}$, $V_{OUT3}$ and the load currents $I_{LOAD1}$, $I_{LOAD2}$, $I_{LOAD3}$ to determine a relationship between the respective output voltage and the respective load current (e.g., an I-V curve), and may use the relationship to determine the magnitude of respective output voltage at which the magnitude of the respective load voltage $V_{LOAD1}$, $V_{LOAD2}$, $V_{LOAD3}$ is approximately equal to the rated load voltage.

The multiple-output load regulation device 710 and/or the calibration devices 730A, 730B, 730C may be configured to initialize the calibration procedure for each of the output voltages $V_{OUT1}$, $V_{OUT2}$, $V_{OUT3}$ in a similar manner as the load regulation device 110 and the calibration device 130 initialize the calibration of the load control system 100 of FIG. 1.

What is claimed is:

1. A system for controlling the amount of power delivered from a power source to an electrical load, the load control system comprising:
   a load regulation device comprising a first terminal and a second terminal, the first and second terminals configured to be coupled to the electrical load via load wiring;
   wherein the load regulation device is configured to generate an output voltage on the first and second terminals for producing a load voltage across the electrical load; and
   a calibration device configured to be coupled to the load wiring in parallel electrical connection between the first and second terminals of the load regulation device and the electrical load; and
   wherein the calibration device is further configured to:
      determine a magnitude of the load voltage across the electrical load;
      determine that the magnitude of the load voltage across the electrical load is greater than or equal to a predetermined level; and
      in response to determining that the magnitude of the load voltage across the electrical load is greater than or equal to a predetermined level, provide feedback to the load regulation device indicating that the magnitude of the load voltage across the electrical load is greater than or equal to the predetermined level,
   wherein the load regulation device is configured to adjust a magnitude of the output voltage based on the feedback from the calibration device indicating that the magnitude of the load voltage across the electrical load is greater than or equal to the predetermined level.

2. The system of claim 1, wherein the load regulation device is configured to gradually increase the magnitude of the output voltage on the first and second terminals until receiving the feedback indicating that the magnitude of the load voltage across the electrical load is greater than or equal to the predetermined level.

3. The system of claim 2, wherein the load regulation device is configured to gradually increase the magnitude of the output voltage on the first and second terminals through a plurality of periodic steps.

4. The system of claim 1, wherein the load regulation device is configured to decrease the magnitude of the output voltage on the first and second terminals after receiving the feedback indicating that the magnitude of the load voltage across the electrical load is greater than the predetermined level.

5. The system of claim 1, wherein the calibration device is configured to provide the feedback by transmitting a digital message to the load regulation device via the load wiring or via a wireless transmission.

6. The system of claim 1, wherein the calibration device is configured to provide the feedback via the load wiring.

7. The system of claim 6, wherein the calibration device is configured to provide the feedback by conducting a current pulse through the load wiring and wherein the load regulation device is configured to gradually increase the magnitude of the output voltage until sensing a current spike.

8. The system of claim 7, wherein the load regulation device is configured to gradually increase the magnitude of the output voltage through a plurality of periodic steps.

9. The system of claim 6, wherein the calibration device is configured to provide the feedback by conducting regular-interval current pulses through the load wiring and wherein the load regulation device is configured to gradually increase the magnitude of the output voltage until no current spike is sensed for a period longer than the regular interval.

10. The system of claim 9, wherein the load regulation device is configured to gradually increase the magnitude of the output voltage through a plurality of periodic steps.

11. The system of claim 1, wherein the calibration device is configured to measure the magnitude of the load voltage prior to providing the feedback.

12. The system of claim 1, wherein the load regulation device is an LED driver and the electrical load is a lighting load.

13. A method for controlling an amount of power delivered from a power source to an electrical load, the method comprising:

- determining, by a calibration device coupled to load wiring in parallel electrical connection between a first terminal and a second terminal of a load regulation device and the electrical load, a magnitude of a load voltage across the electrical load;
- determining, by the calibration device, that the magnitude of the load voltage across the electrical load is greater than or equal to a predetermined level; and
- providing, via the calibration device, feedback indicating whether the magnitude of the load voltage across the electrical load is greater than or equal to the predetermined level;
- receiving, via the load regulation device, the feedback from the calibration device; and
- adjusting, via the load regulation device, a magnitude of an output voltage on the first and second terminals based on the received feedback, wherein the output voltage produces the load voltage across the electrical load.

14. The method of claim 13, further comprising:

gradually increasing, via the load regulation device, the magnitude of the output voltage on the first and second terminals until receiving the feedback indicating that the magnitude of the load voltage across the electrical load is greater than or equal to the predetermined level.

15. The method of claim 13, further comprising:

decreasing, via the load regulation device, the magnitude of the output voltage on the first and second terminals after receiving the feedback indicating that the magnitude of the load voltage across the electrical load is greater than the predetermined level.

16. The method of claim 13, wherein providing feedback via the calibration device comprises transmitting, via the calibration device, a digital message to the load regulation device.

17. The method of claim 13, wherein providing feedback via the calibration device comprises conducting, via the calibration device, a current pulse through the load wiring.

18. The method of claim 13, further comprising measuring, via the calibration device, the magnitude of the load voltage prior to providing feedback.

19. The system of claim 1, wherein the calibration device is configured to be installed immediately adjacent to the electrical load.

20. The system of claim 1, wherein the calibration device is configured to be installed at a location within a final five percent of the load wiring leading to the electrical load from the load regulation device.

* * * * *